(12) United States Patent
Kang et al.

(10) Patent No.: US 12,700,470 B2
(45) Date of Patent: Aug. 4, 2026

(54) MEMORY DEVICE AND METHOD FOR CALIBRATING IMPEDANCE THEREOF

(71) Applicant: SAMSUNG ELECTRONICS CO., LTD., Suwon-si (KR)

(72) Inventors: Youngsan Kang, Suwon-si (KR); Unho Lee, Suwon-si (KR); Jungho Jung, Suwon-si (KR); Jongkyu Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 141 days.

(21) Appl. No.: 18/428,418

(22) Filed: Jan. 31, 2024

(65) Prior Publication Data

US 2025/0022524 A1     Jan. 16, 2025

(30) Foreign Application Priority Data

Jul. 13, 2023     (KR) ........................ 10-2023-0090869

(51) Int. Cl.
*G11C 29/12* (2006.01)
*G11C 7/04* (2006.01)
*G11C 29/46* (2006.01)

(52) U.S. Cl.
CPC ............ *G11C 29/1201* (2013.01); *G11C 7/04* (2013.01); *G11C 29/46* (2013.01); *G11C 2207/2254* (2013.01)

(58) Field of Classification Search
CPC .................................................. G11C 29/1201
See application file for complete search history.

(56) References Cited

U.S. PATENT DOCUMENTS

| | | | |
|---|---|---|---|
| 7,710,143 B2 | 5/2010 | Jeong et al. | |
| 8,118,484 B2 | 2/2012 | Kaszynski et al. | |
| 10,284,198 B2 * | 5/2019 | Lee .................... | H03K 19/0005 |
| 10,530,613 B2 | 1/2020 | Wieduwilt et al. | |
| 10,917,093 B1 * | 2/2021 | He ...................... | G11C 11/4093 |
| 12,531,094 B2 * | 1/2026 | Kim .................... | G11C 7/1057 |
| 2018/0266894 A1 | 9/2018 | Nishiyama et al. | |
| 2021/0099160 A1 | 4/2021 | Gans | |
| 2021/0149423 A1 | 5/2021 | He et al. | |

FOREIGN PATENT DOCUMENTS

| | | |
|---|---|---|
| KR | 10-0853466 | 8/2008 |
| KR | 10-2018-0090266 | 8/2018 |

* cited by examiner

*Primary Examiner* — Douglas King
(74) *Attorney, Agent, or Firm* — Morgan, Lewis & Bockius LLP

(57) ABSTRACT

A memory device includes: a memory cell array; an input/output circuit controlling inputting and outputting data stored in the memory cell array; an impedance calibration circuit generating an impedance calibration code based on an external resistor connected to an impedance pad for application to the input/output circuit as an applied impedance calibration code; and a calibration control circuit comparing a new impedance calibration code received from the impedance calibration circuit with a calibration code range for generating a calibration code update flag when the new impedance calibration code is included in the calibration code range. The impedance calibration circuit updates the applied impedance calibration code with the new impedance calibration code when receiving the calibration code update flag.

14 Claims, 14 Drawing Sheets

100 ZQ Calibration Circuit

ZQCD

200 Calibration Control Unit

210 Code Range Register

TCD

300 Temperature Sensor

FIG.5

| T_test | T_code | ZQ_code | Code Range |
|--------|--------|---------|------------|
| T1(-40°C) | TCD1 | ZQCD1 | ZR1 |
| T2(-25°C) | TCD2 | ZQCD2 | ZR2 |
| T3(-10°C) | TCD3 | ZQCD3 | ZR3 |
| T4(5°C) | TCD4 | ZQCD4 | ZR4 |
| T5(20°C) | TCD5 | ZQCD5 | ZR5 |
| T6(35°C) | TCD6 | ZQCD6 | ZR6 |
| T7(50°C) | TCD7 | ZQCD7 | ZR7 |
| T8(65°C) | TCD8 | ZQCD8 | ZR8 |
| T9(80°C) | TCD9 | ZQCD9 | ZR9 |
| T10(95°C) | TCD10 | ZQCD10 | ZR10 |
| T11(110°C) | TCD11 | ZQCD11 | ZR11 |
| T12(125°C) | TCD12 | ZQCD12 | ZR12 |

ZQCD

RNG1

Sub-comparator 1

221

ZQCD

RNG2

Sub-comparator 2

222

ZQADF

ZQUF

MEMORY DEVICE AND METHOD FOR CALIBRATING IMPEDANCE THEREOF

CROSS-REFERENCE TO RELATED APPLICATIONS

This patent application claims priority under 35 U.S.C. § 119 to Korean Patent Application No. 10-2023-0090869 filed on Jul. 13, 2023, in the Korean Intellectual Property Office, the disclosure of which is incorporated by reference in its entirety herein.

1. TECHNICAL FIELD

The present disclosure relates generally to a semiconductor memory device, and more particularly, to a method of calibrating impedance of a memory device.

2. DISCUSSION OF RELATED ART

Semiconductor memory devices include volatile memory devices and nonvolatile memory devices. Volatile memory devices, for example, a dynamic random access memory (DRAM) device and a static random access memory (SRAM) device, have high reading and writing speeds, but lose their stored data when their power supplies are interrupted. In contrast, nonvolatile memory devices retain their stored data even when their power supplies are interrupted.

Semiconductor memory devices may exchange data with an external device through an input-output circuit. As operating speed of a semiconductor memory device increases, a swing width of a signal transmitted and received between the semiconductor memory device and external device decreases, thereby causing an impedance mismatch. When a signal encounters an impedance mismatch, a portion of the signal is reflected back towards the source, rather than being transmitted to the load. This reflected signal can interfere with the desired signal, causing distortions and signal loss. Impedance calibration may be performed to reduce or prevent the distortions or the signal loss.

SUMMARY

Embodiments of the present disclosure provide a memory device that performs impedance calibration using an impedance calibration code that prevents updates to the impedance calibration code outside a specified range when generating the impedance calibration code and an impedance calibration method thereof.

Embodiments of the present disclosure provide a memory device for preventing updates of an abnormal impedance calibration code by specifying different calibration code ranges depending on a temperature of the memory device when generating an impedance calibration code and an impedance calibration method thereof.

According to an embodiment, a memory device includes: a memory cell array; an input/output circuit; an impedance calibration circuit; and a calibration control circuit. The input/output circuit is for controlling inputting of data to the memory cell array and outputting of data stored in the memory cell array. The impedance calibration circuit is for generating an impedance calibration code based on an external resistor connected to an impedance pad for application to the input/output circuit as an applied impedance calibration code. The calibration control unit is comparing a new impedance calibration code received from the impedance calibration circuit with a calibration code range for generating a calibration code update flag when the new impedance calibration code is included in the calibration code range. The impedance calibration circuit updates the applied impedance calibration code with the new impedance calibration code when receiving the calibration code update flag.

According to an embodiment, an impedance calibration method of a memory device includes: performing an impedance calibration operation to generate a new impedance calibration code; determining whether the new impedance calibration code is included in a first calibration code range; receiving a temperature code when the new impedance calibration code is included in the first calibration code range; determining whether the new impedance calibration code is included in a second calibration code range corresponding to the temperature code; and updating a previous impedance calibration code with the new impedance calibration code when the new impedance calibration code is included in the second calibration code range.

According to an embodiment, a memory device includes: a memory cell array; an input/output circuit; an impedance calibration circuit; and a calibration control circuit. The input/output circuit is for controlling inputting of data to the memory cell array and outputting of data stored in the memory cell array. The impedance calibration circuit is for generating an impedance calibration code based on an external resistor for application to the input/output circuit as an applied impedance calibration code. The calibration control circuit is comparing a new impedance calibration code received from the impedance calibration circuit with a calibration code range to generate a calibration code update flag when the new impedance calibration code is included in the calibration code range. The impedance calibration circuit includes: an impedance pad connected to the external resistor; a pull-down driver connected to the impedance pad; a code generator comparing a voltage of the impedance pad and a target voltage to generate a new impedance calibration code; and a pull-down code control circuit receiving the new impedance calibration code and updating the applied impedance calibration code to the new impedance calibration code when receiving the calibration code update flag within a specified time after transmitting the new pull-down impedance calibration code to the calibration control circuit.

BRIEF DESCRIPTION OF THE FIGURES

The above and other objects and features of the present disclosure will become apparent by describing in detail embodiments thereof with reference to the accompanying drawings.

FIG. 1 is a block diagram illustrating a memory system according to an example embodiment.

FIG. 4 is a block diagram illustrating operations of an impedance calibration circuit, a calibration control unit, and a temperature sensor during a calibration code variation test of FIG. 3.

FIG. 5 is a table illustrating an example of calibration code range information obtained in a calibration code variation test of FIG. 3.

FIG. 8 is a block diagram illustrating an operation of a code comparator of FIG. 7.

FIG. 11 is a block diagram illustrating an impedance calibration circuit of FIG. 2.

FIG. 12 is a block diagram illustrating a memory system according to an example embodiment.

FIG. 13 is a block diagram illustrating a memory device of FIG. 12.

DETAILED DESCRIPTION

Figure 2:
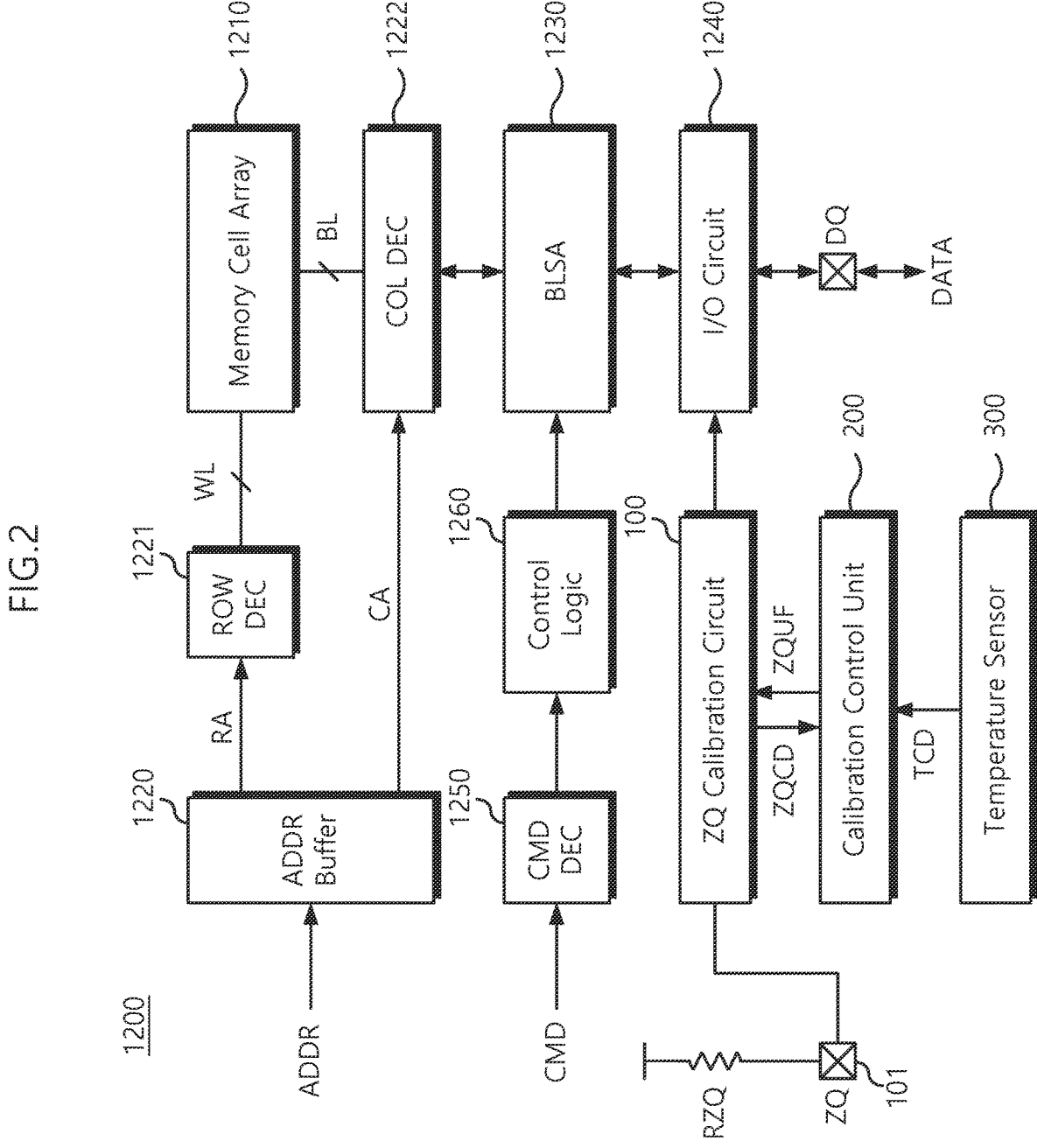
FIG. 2 is a block diagram illustrating the memory device of FIG. 1.

Below, example embodiments of the present disclosure will be described in detail and clearly to such an extent that one of ordinary skill in the art may implement the inventive concepts.

Below, a DRAM will be used as an example of the memory device for illustrating features and functions of the present disclosure. However, the inventive concept is not limited to a DRAM as other types of memory devices may be used in alternate embodiments. Further, the detailed description may be modified according to various viewpoints and applications without deviating from the scope, spirit, and other objects of the present disclosure.

Figure 1:
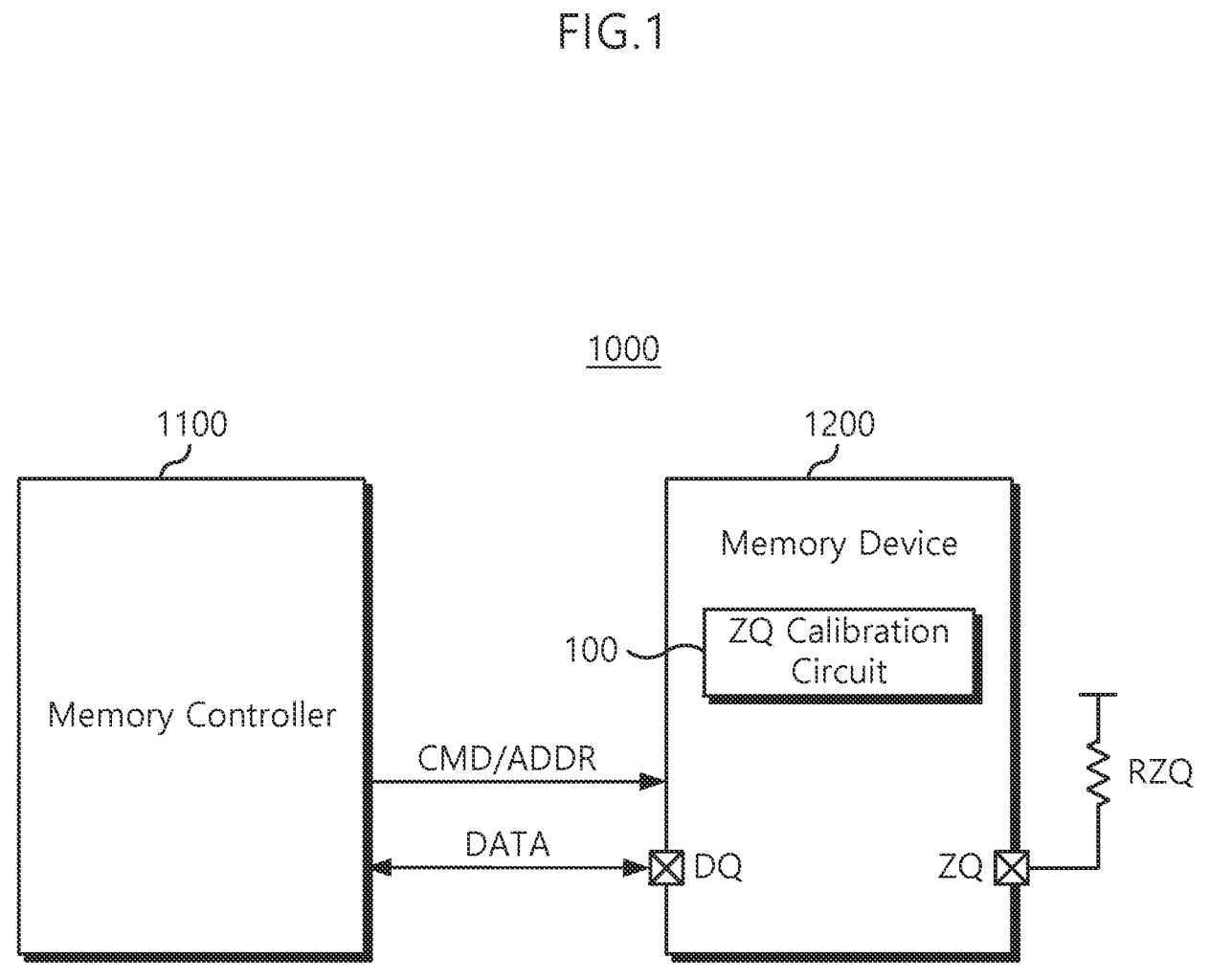

FIG. 1 is a block diagram illustrating a memory system according to an example embodiment. Referring to FIG. 1, a memory system 1000 may include a memory controller 1100 (e.g., a control circuit) and a memory device 1200.

According to an example embodiment, the memory controller 1100 may perform an access operation to write data in the memory device 1200 or to read data stored in the memory device 1200. For example, the memory controller 1100 may generate a command CMD and an address ADDR for writing data in the memory device 1200 or reading data stored in the memory device 1200. The memory controller 1100 may include at least one of a control circuit controlling the memory device 1200, a system-on-chip (SoC) such as an application processor (AP), a central processing unit (CPU), a digital signal processor (DSP), and a graphics processing unit (GPU).

According to an example embodiment, the memory controller 1100 may provide various signals to the memory device 1200 to control an overall operation of the memory device 1200. For example, the memory controller 1100 may control memory access operations of the memory device 1200 such as a read operation and a write operation. The memory controller 1100 may provide the command CMD and the address ADDR to the memory device 1200 to write data DATA in the memory device 1200 or to read data DATA from the memory device 1200.

According to an example embodiment, the memory controller 1100 may generate various types of commands CMD (or requests) to control the memory device 1200. For example, the memory controller 1100 may generate a bank request to perform a bank operation for changing a state of a memory bank, among memory banks of the memory device 1200, to read or write data DATA. As an example, the bank request may include an active request for changing a state of a memory bank, among the memory banks, to an active state. The memory device 1200 may activate a row included in the memory bank, for example, a wordline, in response to the active request. The bank request may include a precharge request for changing the memory banks from an active state to a standby state after reading or writing of data DATA has completed. In addition, the memory controller 1100 may generate an input/output (I/O) request (for example, a column address strobe (CAS) request) for the memory device 1200 to perform a read operation or a write operation of data DATA. As an example, the I/O request may include a read request for reading data DATA from activated memory banks. The I/O request may include a write request for writing data DATA in the activated memory banks. The memory controller 1100 may generate a refresh command to perform a refresh operation on the memory banks. However, the types of commands CMD described herein are merely exemplary, and other types of commands CMD may be present.

According to an example embodiment, the memory device 1200 may output data DATA, requested to be read by the memory controller 1100, to the memory controller 1100 or may store data DATA, requested to be written by the memory controller 1100, in a memory cell of the memory device 1200. The memory device 1200 may input and output data DATA based on the command CMD and the address ADDR. The memory device 1200 may include memory banks. The memory device 1200 may include at least one data pad DQ. The memory device 1200 may input and output data DATA through the data pad DQ. The data pad DQ may be connected to an input/output (I/O) circuit.

The memory device 1200 may be a volatile memory device such as a dynamic random access memory (DRAM), a synchronous dynamic random access memory (SDRAM), a double data rate (DDR) DRAM, a DDR SDRAM, a low-power double data rate (LPDDR) SDRAM, a graphics double data rate (GDDR) SDRAM, a Rambus dynamic random access memory (RDRAM), and a static random access memory (SRAM), or the like. Alternatively, the memory device 1200 may be implemented as a nonvolatile memory device such as a resistive RAM (RRAM), a phase change memory (PRAM), a magnetoresistive memory (MRAM), a ferroelectric memory (FRAM), a spin-transfer torque RAM (STT-RAM), or the like. In the present specification, the present disclosure has been described with respect to a DRAM, but example embodiments are not limited thereto.

According to an example embodiment, the memory banks may include a memory cell array divided in units of banks, a row decoder (e.g., a first decoder circuit), a column decoder (e.g., a second decoder circuit), a sense amplifier, a write driver (e.g., a driver circuit), or the like. The memory banks may store data DATA, requested to be written in the memory device 1200, through the write driver and may read data DATA, requested to be read, using the sense amplifier. The memory banks may further include a component for performing a refresh operation of storing and maintaining data in the cell array, or select circuits based on an address.

According to an example embodiment, the memory device 1200 includes an impedance calibration circuit (or ZQ calibration circuit) 100. For example, impedance of the data pad DQ may change according to a state variation (for example, process, voltage and temperature (PVT) fluctuations) of the memory device 1200. The impedance calibration circuit 100 may generate an impedance calibration code used in the I/O circuit through the impedance pad ZQ. The memory device 1200 may apply the impedance calibration code to the I/O circuit to transmit and receive data DATA. As an example, an external resistor RZQ, which is a reference for the impedance calibration, may be connected between a power supply voltage terminal and the impedance pad ZQ. In another example, the external resistor RZQ may be connected between the impedance pad ZQ and a ground. The power supply voltage terminal may provide a supply voltage and the ground may provide a ground voltage. The supply voltage may be a positive voltage greater than the ground voltage, but is not limited thereto. For example, the supply voltage may be a negative voltage less than the ground voltage.

According to an example embodiment, the impedance calibration circuit 100 may generate an abnormal impedance calibration code due to various causes. For example, the impedance calibration circuit 100 may generate an abnormal impedance calibration code when performing a latch operation of the impedance calibration code before completing an impedance calibration operation or when a sudden temperature change of the memory device 1200 occurs. When an abnormal impedance calibration code is applied to the I/O circuit, the memory device 1200 may exchange incorrect data with the memory controller 1100. In an embodiment, the memory device 1200 sets a specified code range of a normal impedance calibration code and blocks an update of a newly generated impedance calibration code to prevent the abnormal impedance calibration code being applied to the I/O circuit when the newly generated impedance calibration code is outside the specified code range.

FIG. 2 is a block diagram illustrating a memory device of FIG. 1 according to an embodiment. Referring to FIG. 2, the memory device 1200 includes a memory cell array 1210, an address buffer 1220, a row decoder 1221 (e.g., a first decoder circuit), a column decoder 1222 (e.g., a second decoder circuit), a bitline sense amplifier 1230, an input/output circuit 1240, a command decoder 1250, control logic 1260 (e.g., a logic circuit), a impedance calibration circuit 100, a calibration control unit 200 (e.g., a calibration circuit), and a temperature sensor 300 (e.g., a temperature sensing circuit).

According to an example embodiment, the memory cell array 1210 may include a plurality of memory cells arranged in a matrix of rows and columns. For example, the memory cell array 1210 may include a plurality of wordlines WL and a plurality of bitlines BL connected to memory cells. The plurality of wordlines WL may be connected to rows of the memory cells, and the plurality of bitlines BL may be connected to columns of the memory cells.

According to an example embodiment, the address buffer 1220 may receive an address ADDR from the memory controller 1100 of FIG. 1. For example, the address ADDR may include a row address RA for addressing a row of the memory cell array 1210 and a column address CA for addressing a column of the memory cell array 1210. The address buffer 1220 may transmit the row address RA to the row decoder 1221 and may transmit the column address CA to the column decoder 1222.

According to an example embodiment, the row decoder 1221 may select one of the plurality of wordlines WL connected to the memory cell array 1210. The row decoder 1221 may decode the row address RA, received from the address buffer 1220, to select a single wordline corresponding to the row address RA and may activate the selected wordline.

According to an example embodiment, the column decoder 1222 may select a predetermined bitline from among the plurality of bitlines BL of the memory cell array 1210. The column decoder 1222 may decode the column address CA, received from the address buffer 1220, to select the predetermined bitline BL corresponding to the column address CA.

According to an example embodiment, the bitline sense amplifier 1230 may be connected to the bitlines BL of the memory cell array 1210. For example, the bitline sense amplifier 1230 may sense a change in voltage of a selected bitline, among the plurality of bitlines BL, and may amplify and output the change in voltage.

According to an example embodiment, the input/output circuit 1240 outputs data DATA to the memory controller 1100 through the data pad DQ based on a sensed and amplified voltage from the bitline sense amplifier 1230. For example, the input/output circuit 1240 may include an input buffer or an output buffer. The input buffer or the output buffer may be connected to the data pad DQ.

According to an example embodiment, the command decoder 1250 (e.g., a decoder circuit) may decode a write enable signal/WE, a row address strobe signal/RAS, a column address strobe signal /CAS, and a chip select signal /CS received from the memory controller 1100 such that control signals corresponding to the command CMD are generated in the control logic 1260. The command CMD may include an active request, a read request, a write request, or a precharge request. The control logic 1260 may control an overall operation of the bitline sense amplifier (BLSA) 1230 through the control signals corresponding to the command CMD.

According to an example embodiment, the impedance calibration circuit (or ZQ calibration circuit) 100 may perform an impedance calibration operation to generate an impedance calibration code ZQCD applied to the input/output circuit 1240. For example, an external resistance RZQ, which is used for the impedance calibration operation, may be connected between an impedance pad ZQ and a power supply voltage terminal. The impedance calibration circuit 100 may generate an impedance calibration code ZQCD applied to the input/output circuit 1240 through the impedance pad ZQ.

According to an example embodiment, the calibration control unit 200 may check whether the impedance calibration code ZQCD is abnormal. For example, the calibration control unit 200 may receive a newly generated impedance calibration code ZQCD from the impedance calibration circuit 100. The calibration control unit 200 may check whether the newly generated impedance calibration code ZQCD is within a specified code range. When the newly generated impedance calibration code ZQCD is included within the specified code range, the calibration control unit 200 may generate a calibration code update flag ZQUF. Depending on whether the calibration code update flag ZQUF is received, the impedance calibration circuit 100 may determine whether to update the newly generated impedance calibration code ZQCD. In an embodiment, the calibration control unit 200 may output a signal to the impedance calibration circuit 100 indicating whether the impedance calibration code ZQCD is abnormal or normal.

As an example, the calibration control unit 200 may check whether the impedance calibration code ZQCD is included in a first code range. When the impedance calibration code ZQCD is included in the first code range, the calibration control unit 200 may receive a temperature code TCD including temperature information of the current memory device 1200 from the temperature sensor 300. The calibration control unit 200 may check whether the impedance calibration code ZQCD is included in a specified second code range corresponding to the temperature code TCD. When the impedance calibration code ZQCD is included in the second code range, the calibration control unit 200 may transmit the calibration code update flag ZQUF to the impedance calibration circuit 100. When receiving the calibration code update flag ZQUE, the impedance calibration circuit 100 may store (or update) the newly generated impedance calibration code ZQCD and provide it to the input/output circuit 1240. In an embodiment when the impedance calibration code ZQCD is not included in the first code range or the second code range, the impedance calibration circuit 100 does not output the calibration code update flag ZQUF. In an embodiment, when the calibration code update flag ZQUF is not received within a specified time after transmitting the impedance calibration code ZQCD to the calibration control unit 200, the impedance calibration circuit 100 does not update the newly generated impedance calibration code ZQCD and retains a previous impedance calibration code. In an embodiment, the impedance calibration circuit 100 does not update the newly generated impedance calibration code ZQCD when it receives a control signal from the impedance calibration circuit 100 indicating an abnormal state.

According to an example embodiment, the temperature sensor 300 may measure a current temperature of the memory device 1200. For example, the temperature sensor 300 may transmit a temperature code TCD including current temperature information of the memory device 1200 to the calibration control unit 200.

Figure 3:
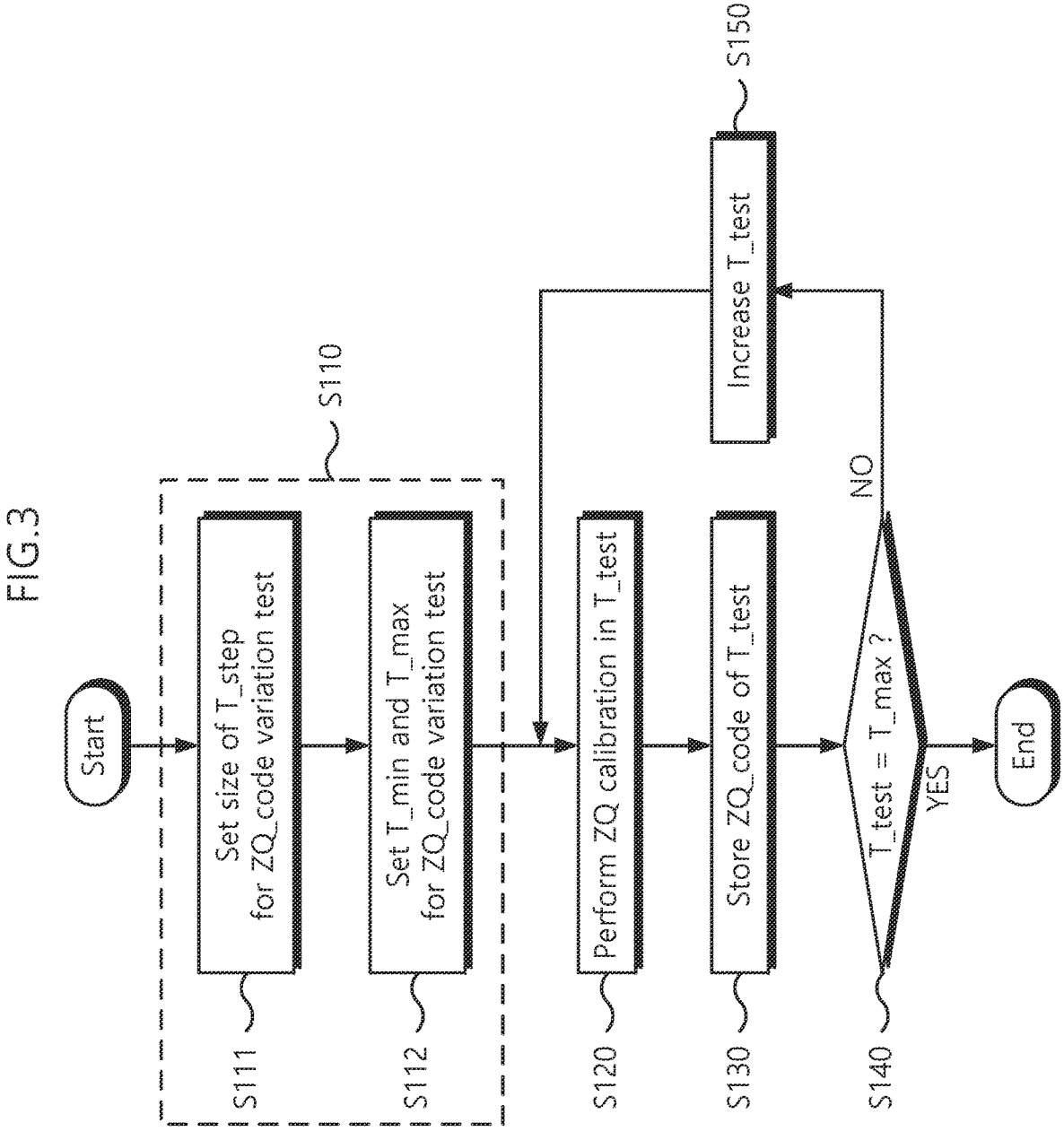
FIG. 3 is a flow chart illustrating a calibration code variation test in the memory device of FIG. 2.
Figure 4:
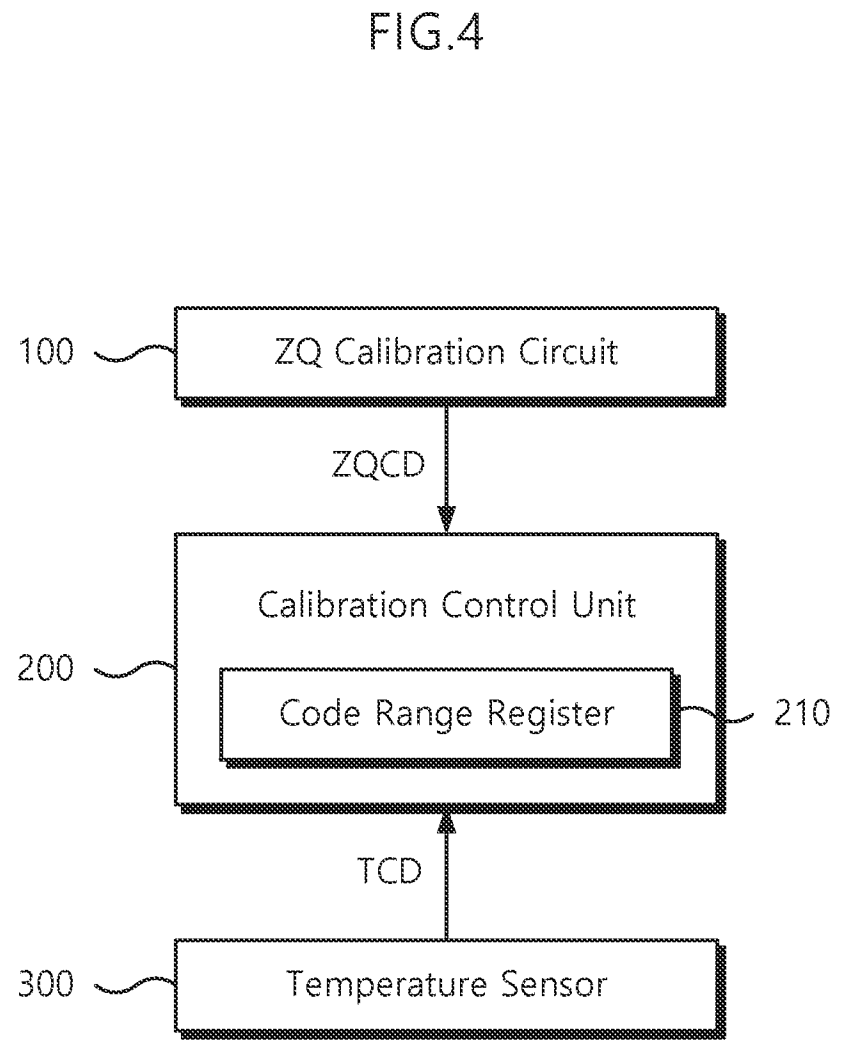

FIG. 3 is a flow chart illustrating a calibration code variation test in the memory device of FIG. 2 according to an example embodiment. FIG. 4 is a block diagram illustrating operations of an impedance calibration circuit, a calibration control unit, and a temperature sensor during a calibration code variation test of FIG. 3 according to example embodiments. FIG. 5 is a table illustrating an example of calibration code range information obtained in a calibration code variation test of FIG. 3.

Referring to FIGS. 2 to 5, the memory device 1200 may beforehand store calibration code range information to be used by the calibration control unit 200 through a calibration code variation test. The calibration control unit 200 may include a code range register 210 storing the calibration code range information. As an example, the calibration code variation test may be performed during a die test or a package test of the memory device 1200. The calibration code variation test may be performed while changing a temperature of the memory device 1200 within a specified range. For example, the calibration code variation test may be performed when the temperature of the memory device 1200 is within the specified range.

According to an example embodiment, in operation S110, the memory device 1200 sets conditions for a calibration code variation test. For example, in operation S111, the memory device 1200 sets a size of a temperature step (T_step) (or temperature interval) for measuring an impedance calibration code ZQCD during the calibration code variation test. As an example, in FIG. 5, in operation S112, the memory device 1200 may set a minimum reference temperature (T_min) and a maximum reference temperature (T_max) for measuring the impedance calibration code ZQCD during the calibration code variation test. In an embodiment, the memory device 1200 determines a plurality of test temperatures (T_test) based on the temperature step (T_step), the minimum reference temperature (T_min), and the maximum reference temperature (T_max). As an example, the minimum reference temperature (T_min) and the maximum reference temperature (T_max) may be determined based on an operating critical temperature of the memory device 1200. As another example, the maximum reference temperature (T_max) may be determined based on the minimum reference temperature (T_min), the temperature step (T_step), and performing times of a calibration code variation test.

As an example, in FIG. 5, the temperature step (T_step) may be set to 15 degrees. The minimum reference temperature (T_min) may be set to –40 degrees Celsius. The maximum reference temperature (T_max) may be set to 125 degrees Celsius. Accordingly, the plurality of test temperatures (T_test) may be determined from a first test temperature (T1) (for example, –40 degrees Celsius) to the twelfth test temperature (T12) (for example, 125 degrees Celsius). That is, the performing times of the calibration code variation test may be set to 12. For example, the number of the performing times may correspond to the number of steps between T_max and T_min.

According to an example embodiment, in operation S120, the memory device 1200 perform an impedance calibration (ZQ) operation at a specified test temperature (T_test). For example, the calibration control unit 200 may receive a temperature code TCD including current temperature information from the temperature sensor 300. When the current temperature reaches each of the plurality of test temperatures (T_test), the calibration control unit 200 may store the temperature code TCD in the code range register 210. When the current temperature reaches the current test temperature (T_test), the impedance calibration circuit 100 may perform an impedance calibration operation. An impedance calibration operation may be started from the minimum reference temperature (T_min). As an example, in FIG. 5, the impedance calibration circuit 100 may perform an impedance calibration operation at a first test temperature (T1) (for example, –40 degrees Celsius) to a twelfth test temperature (T12) (for example, 125 degrees Celsius).

According to an example embodiment, in operation S130, the memory device 1200 stores an impedance calibration code ZQCD of an test temperature (T_test). For example, the calibration control unit 200 may store an impedance calibration code ZQCD corresponding to each of the plurality of test temperatures (T_test) in the code range register 210. As an example, in FIG. 5, the calibration control unit 200 may respectively match a first impedance calibration code (ZQCD1) to a twelfth impedance calibration code (ZQCD12) corresponding to a first temperature code (TCD1) to a twelfth temperature code (TCD12) to store to register the code range register 210.

According to an example embodiment, in operation S140, the memory device 1200 compares the test temperature (T_test) and the maximum reference temperature (T_max). For example, when the current test temperature (T_test) is different from the maximum reference temperature (T_max) (or when the current test temperature (T_test) is less than the maximum reference temperature (T_max)), the memory device 1200 may perform operation S150. When the current test temperature (T_test) is equal to the maximum reference temperature (T_max), the memory device 1200 may end the calibration code variation test.

According to an example embodiment, in operation S150, the memory device 1200 increases the test temperature (T_test). In an embodiment, the memory device 1200 includes a heating element and controls the heating element to increase the test temperature (T_Test) as needed. In an embodiment, the memory device 1200 includes a processor that performs operations to increase the test temperature (T_Test) as needed. For example, when the current test temperature (T_test) is different from the maximum reference temperature (T_max) (or when the current test temperature (T_test) is less than the maximum reference temperature (T_max)), the memory device 1200 may repeatedly perform operations S120 to S140 at a next test temperature as one more temperature step (T_step) as a current test temperature. The memory device 1200 may repeatedly perform operations S120 to S140 at a plurality of test temperatures (T_test) to store the table of FIG. 5 in the code range register 210.

Figure 6:
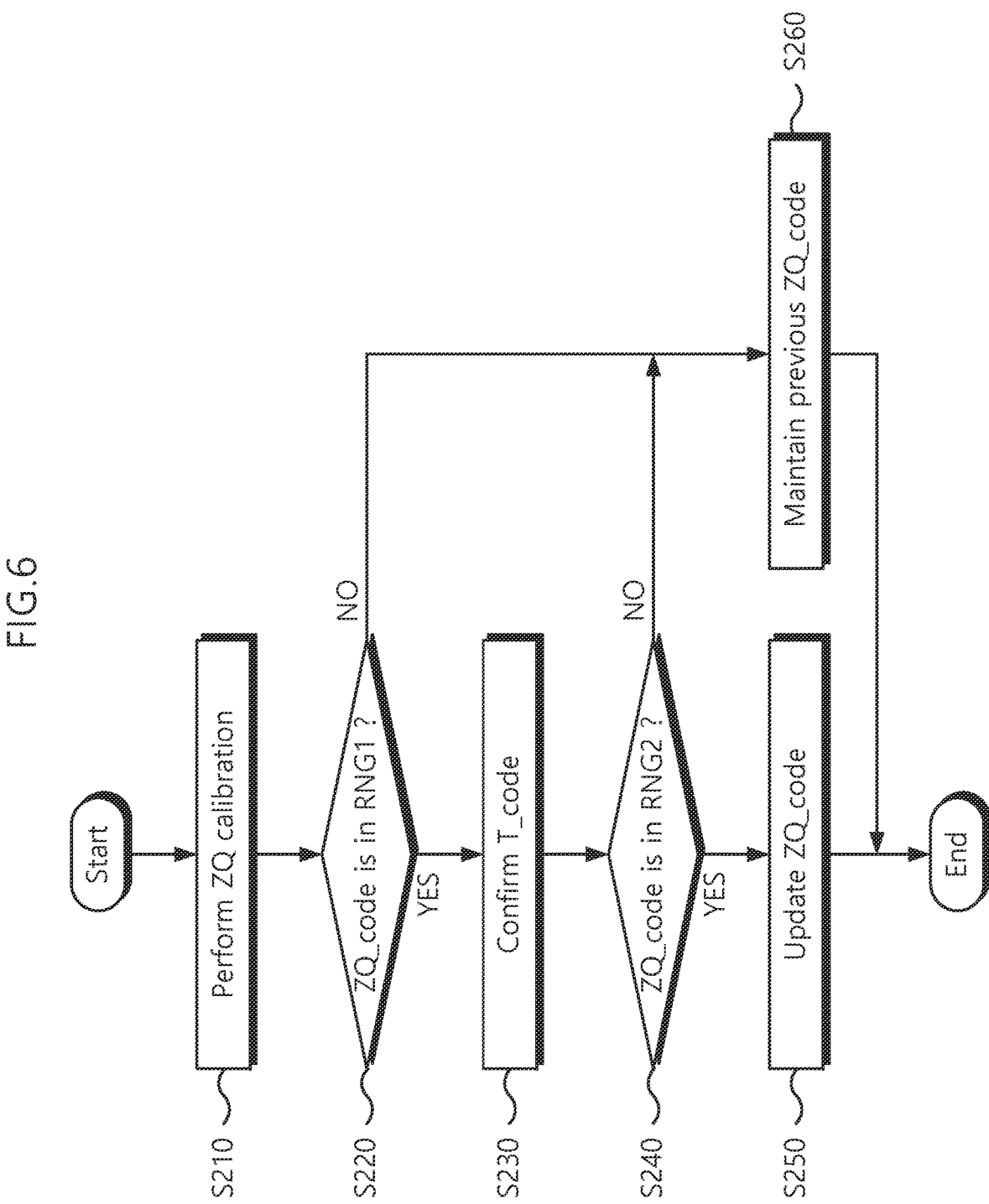
FIG. 6 is a flowchart illustrating an impedance calibration method of a memory device of FIG. 2 according to an example embodiment.
Figure 7:
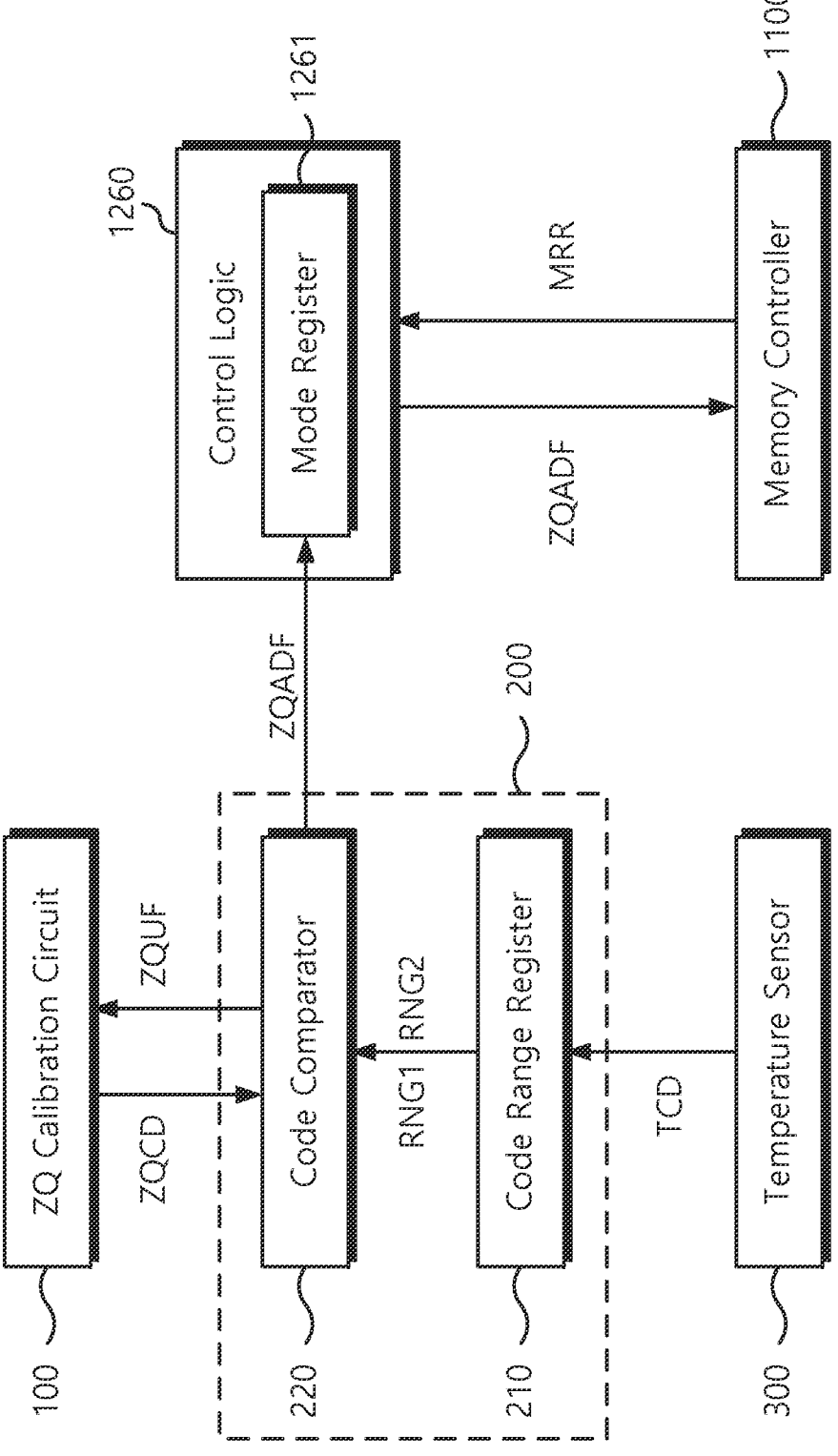
FIG. 7 is a block diagram illustrating an operation of a calibration control unit of FIG. 2.
Figure 8:
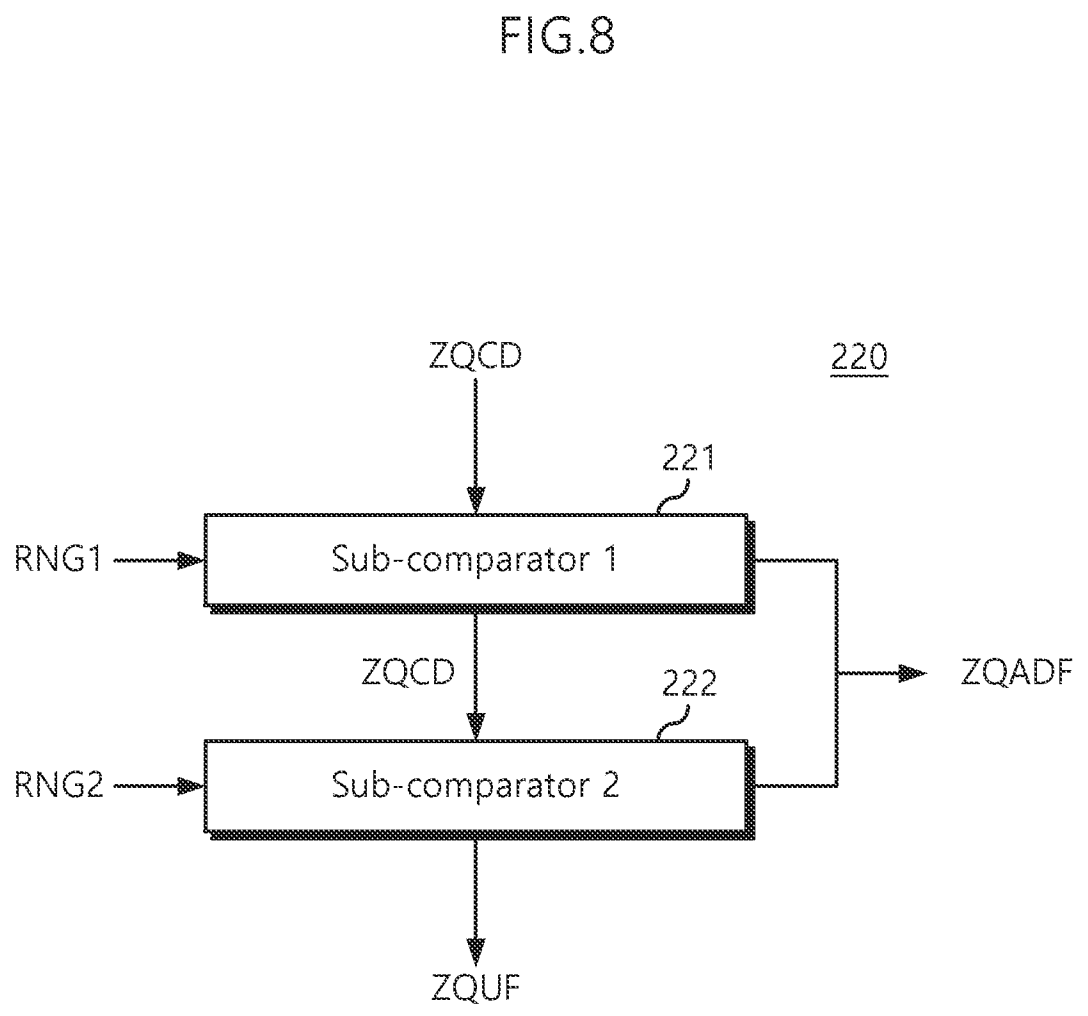

FIG. 6 is a flowchart illustrating an impedance calibration method of a memory device of FIG. 2 according to an example embodiment. FIG. 7 is a block diagram illustrating an operation of a calibration control unit of FIG. 2 according to an example embodiment. FIG. 8 is a block diagram illustrating an operation of a code comparator of FIG. 7 according to an example embodiment. Referring to FIGS. 2 and 6 to 8, the memory device 1200 may prevent updating an abnormal impedance calibration code. The calibration control unit 200 may include a code range register 210 and a code comparator 220 (e.g., a comparator circuit). The code comparator 220 may include a first sub-comparator 221 and a second sub-comparator 222.

According to an example embodiment, in operation S210, the memory device 1200 performs an impedance calibration operation. For example, the impedance calibration circuit 100 may perform an impedance calibration operation periodically or aperiodically at specified times (for example, when booting, rebooting, changing an operating voltage, or receiving a command from the memory controller 1100) to generate a calibration code ZQCD. The impedance calibration circuit 100 may transmit a newly generated impedance calibration code ZQCD to the calibration control unit 200.

According to an example embodiment, in operation S220, the memory device 1200 confirms whether an impedance calibration code ZQCD satisfies a first calibration code range RNG1. For example, the calibration control unit 200 may compare the first calibration code range RNG1 and the impedance calibration code ZQCD stored in the code range register 210. The first sub-comparator 221 (or the code comparator 220) may receive the first calibration code range RNG1 from the code range register 210. The first sub-comparator 221 (or the code comparator 220) may determine whether the impedance calibration code ZQCD is included in the first calibration code range RNG1. When the impedance calibration code ZQCD is within the first calibration code range RNG1, the memory device 1200 performs operation S230. When the impedance calibration code ZQCD is within the first calibration code range RNG1, the first sub-comparator 221 may transmit the impedance calibration code ZQCD to the second sub-comparator 222. When the impedance calibration code ZQCD is outside the first calibration code range RNG1, the memory device 1200 performs operation S260. When the impedance calibration code ZQCD is outside the first calibration code range RNG1, the first sub-comparator 221 (or the code comparator 220) may generate and output an abnormal code detection flag ZQADF. The abnormal code detection flag ZQADF may be stored in a mode register 1261 of the control logic 1260.

According to an example embodiment, the first calibration code range RNG1 is set to include all impedance calibration codes obtained in the calibration code variation test of FIG. 3. As an example, the first calibration code range RNG1 may be set between the minimum and maximum calibration codes among the impedance calibration codes of FIG. 5 (for example, the first impedance calibration code (ZQCD1) to the twelfth impedance calibration code (ZQCD12)). As another example, the first calibration code range RNG1 may be set between a minimum value which is a specified size smaller than the minimum calibration code and a maximum value which is a specified size larger than the maximum calibration code.

According to an example embodiment, in operation S230, the memory device 1200 checks a current temperature code. For example, the calibration control unit 200 may receive a temperature code TCD from the temperature sensor 300. The code range register 210 may transmit a second calibration code range RNG2 corresponding to the temperature code TCD to the code comparator 220. As an example, the second calibration code range RNG2 may be set to be smaller than the first calibration code range RNG1 within the first calibration code range RNG1. The second calibration code range RNG2 (for example, the first code range (ZR1) to the twelfth code range (ZR12) in FIG. 5) may be set to a specified range around each impedance calibration code (for example, the first impedance calibration code (ZQCD1) to the twelfth impedance calibration code (ZQCD12) of FIG. 5) corresponding to each temperature code (for example, the first temperature code (TCD1) to the twelfth temperature code (TCD12) in FIG. 5).

According to an example embodiment, in operation S240, the memory device 1200 confirms whether the impedance calibration code ZQCD satisfies the second calibration code range RNG2. For example, the calibration control unit 200 may compare the second calibration code range RNG2 and the impedance calibration code ZQCD stored in the code range register 210. The second sub-comparator 222 (or the code comparator 220) may receive the second calibration code range RNG2 from the code range register 210. The second sub-comparator 222 (or the code comparator 220) may determine whether the impedance calibration code ZQCD is included in the second calibration code range RNG2. When the impedance calibration code ZQCD is within the second calibration code range RNG2, the memory device 1200 performs operation S250. When the impedance calibration code ZQCD is within the second calibration code range RNG2, the second sub-comparator 222 may transmit the calibration code update flag ZQUF to the impedance calibration circuit 100. When the impedance calibration code ZQCD is outside the second calibration code range RNG2, the memory device 1200 performs operation S260. When the impedance calibration code ZQCD is outside the second calibration code range RNG2, the second sub-comparator 222 (or the code comparator 220) may generate and output an abnormal code detection flag ZQADF. The detection flag ZQADF may be stored in the mode register 1261 of the control logic 1260.

According to an example embodiment, in operation S250, the memory device 1200 updates the impedance calibration code ZQCD. For example, when receiving the calibration code update flag ZQUF, the impedance calibration circuit 100 may update (or replace) a previous impedance calibration code with the newly generated impedance calibration code ZQCD.

According to an example embodiment, in operation S260, the memory device 1200 maintains a previous impedance calibration code. For example, when the impedance calibration code ZQCD is outside the first calibration code range RNG1 or the second calibration code range RNG2, the calibration control unit 200 does not generate the calibration code update flag ZQUF. When the calibration code update flag ZQUF is not received, the impedance calibration circuit 100 may determine the newly generated impedance calibration code ZQCD to be abnormal and discard the newly generated impedance calibration code ZQCD. Additionally, the impedance calibration circuit 100 may maintain the previous impedance calibration code. Accordingly, the memory device 1200 may prevent an abnormal impedance calibration code from being applied to the input/output circuit 1240.

According to an example embodiment, when the impedance calibration code ZQCD is outside the first calibration code range RNG1 or the second calibration code range RNG2, the memory device 1200 may store the abnormal code detection flag ZQADF in the mode register (referring to operations S220 and S240). In an embodiment, the memory device 1200 provides the abnormal code detection flag ZQADF stored in the mode register 1261 to the memory controller 1100 in response to receiving a mode register read command MRR from the memory controller 1100. Accordingly, the memory controller 1100 may use the abnormal code detection flag ZQADF as a reference to prevent generating an abnormal impedance calibration code.

Figure 9:
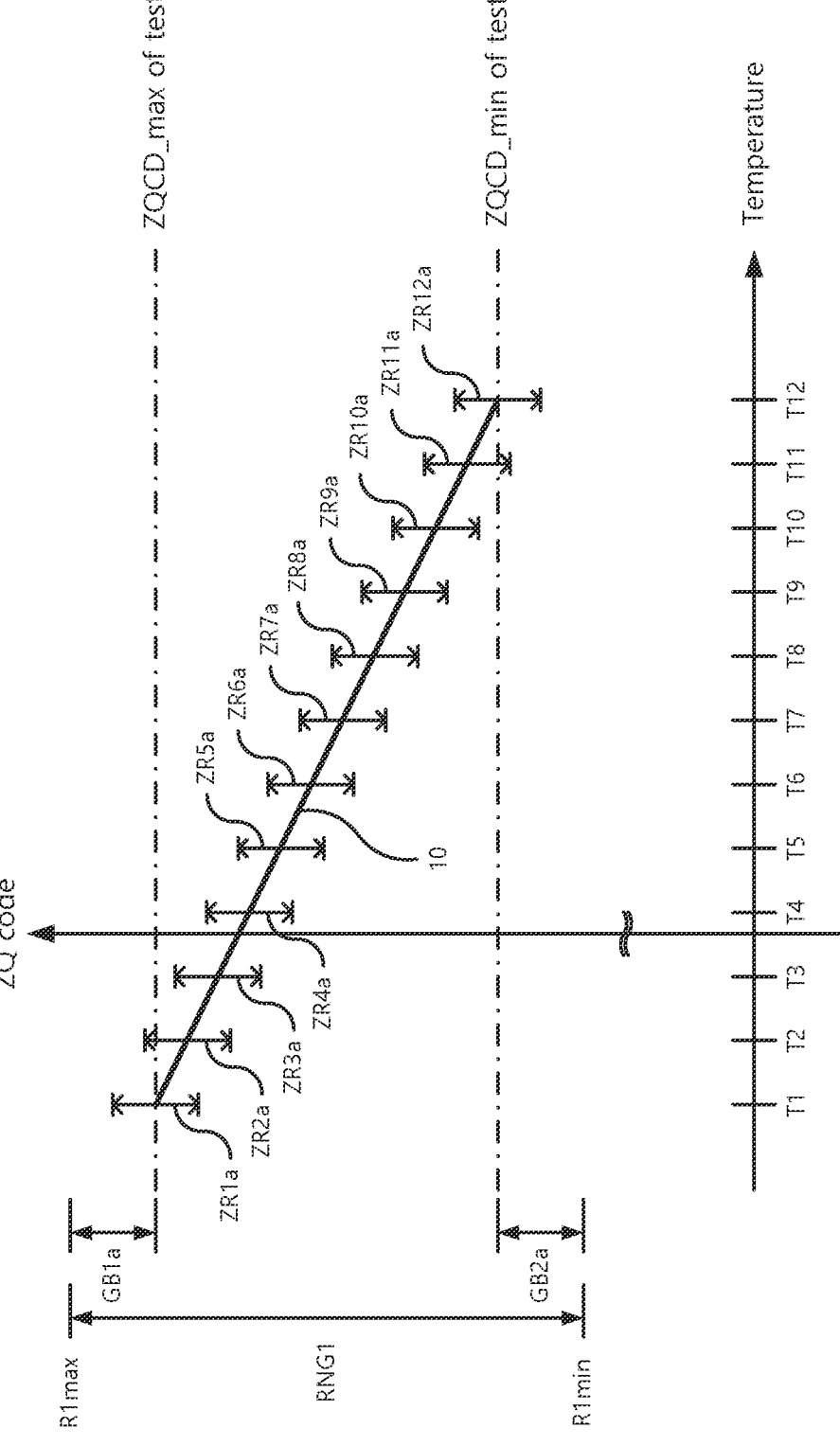
FIG. 9 is a diagram illustrating an example of a first calibration code range and a second calibration code range used in an impedance calibration method of FIG. 6.

FIG. 9 is a diagram illustrating an example of a first calibration code range and a second calibration code range used in an impedance calibration method of FIG. 6. Referring to FIGS. 3, 5 and 9, a plurality of impedance calibration codes 10 obtained through a calibration code variation test of FIG. 3 may be linearly distributed with respect to a temperature of the memory device 1200.

According to an example embodiment, the memory device 1200 may set the first calibration code range RNG1 to include both the maximum impedance calibration code ZQCD_max and the minimum impedance calibration code ZQCD_min. For example, when the plurality of impedance calibration codes 10 are linearly distributed, the maximum impedance calibration code ZQCD_max is measured at the lowest test temperature (for example, the first test temperature (T1)), and the minimum impedance calibration code ZQCD_min may be measured at the highest test temperature (for example, a twelfth test temperature (T12)). The memory device 1200 may set to a range of between a maximum range code RImax which is greater than the maximum impedance calibration code ZQCD_max by a first guard band GB1a and a minimum range code R1min which is smaller than the minimum impedance calibration code ZQCD_min by a second guard band GB2a as the first calibration code range RNG1.

According to an example embodiment, when the plurality of impedance calibration codes 10 are linearly distributed, the memory device 1200 may set temperature codes (for example, the first temperature code TCD1 to the twelfth temperature code TCD12 in FIG. 5) corresponding to impedance calibration codes (for example, the first impedance calibration code (ZQCD1) to the twelfth impedance calibration code (ZQCD12) in FIG. 5) to be equal to each other. For example, the memory device 1200 may set a second calibration code range RNG2 (for example, a first code range ZR1a to a twelfth code range ZR12a) at each test temperature (for example, the first test temperature (T1) to the twelfth test temperature (T12)). As an example, when the plurality of impedance calibration codes 10 are linearly distributed, the first code range ZR1a to the twelfth code range ZR12a may be set to be equal to each other.

Figure 10:
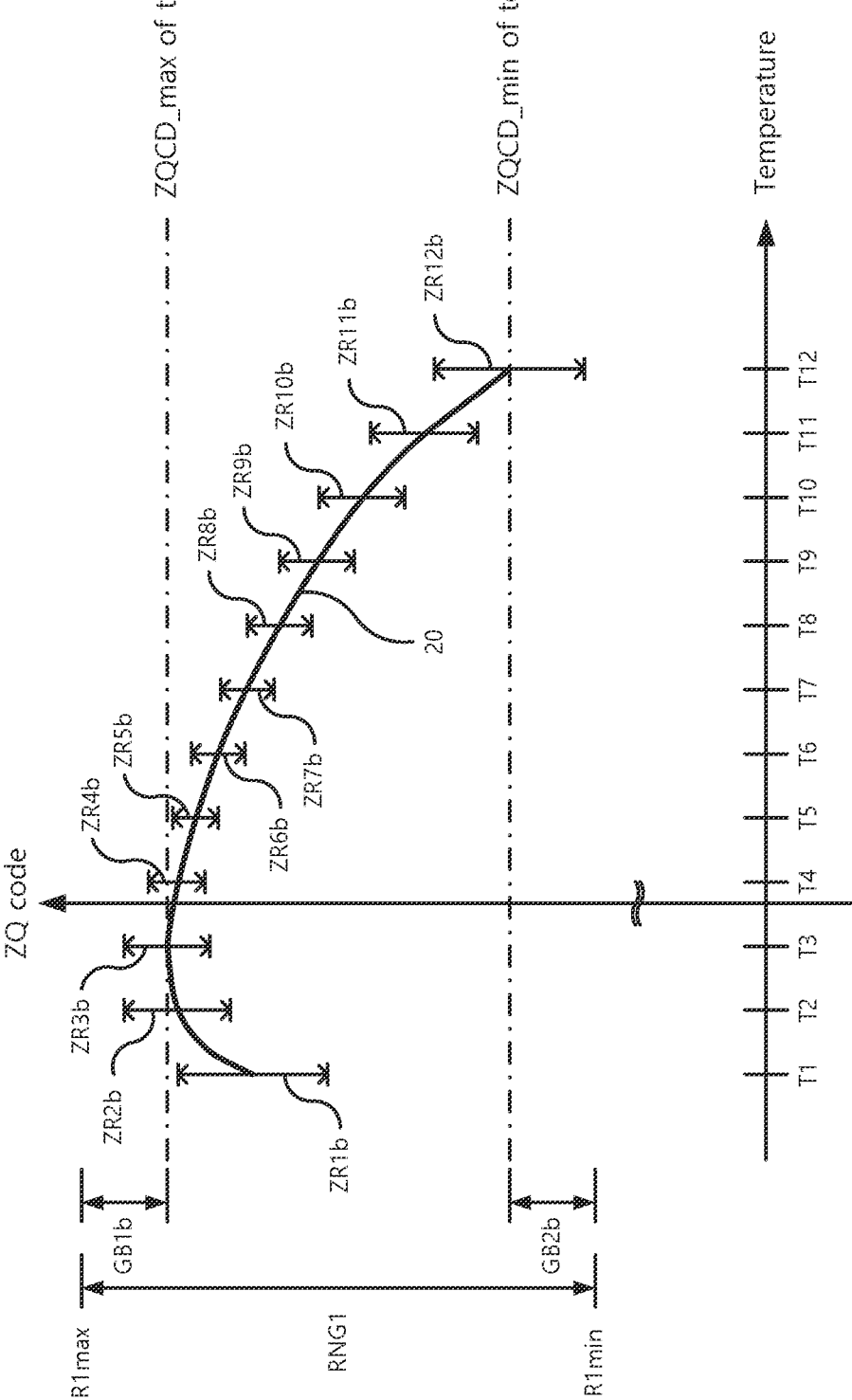
FIG. 10 is a diagram illustrating another example of a first calibration code range and a second calibration code range used in an impedance calibration method of FIG. 6.

FIG. 10 is a diagram illustrating an example of a first calibration code range and a second calibration code range used in an impedance calibration method of FIG. 6. Referring to FIGS. 3, 5, and 10, a plurality of impedance calibration codes 20 obtained through a calibration code variation test of FIG. 3 may be distributed non-linearly with respect to a temperature of the memory device 1200.

According to an example embodiment, the memory device 1200 may set a first calibration code range RNG1 to include both a maximum impedance calibration code ZQCD_max and a minimum impedance calibration code ZQCD_min. For example, when the plurality of impedance calibration codes 20 are non-linearly distributed, the maximum impedance calibration code ZQCD_max is not measured at the lowest test temperature (for example, the first test temperature (T1)). The maximum impedance calibration code ZQCD_max may be measured at a test temperature (for example, the third test temperature (T3)) other than the lowest test temperature, and the minimum impedance calibration code ZQCD_min may be measured at the highest test temperature (for example, the twelfth test temperature (T12)). The memory device 1200 may set to a range of between a maximum range code RImax which is greater than the maximum impedance calibration code ZQCD_max by a first guard band GB1b and a minimum range code R1min which is smaller than the minimum impedance calibration code ZQCD_min by a second guard band GB2b as the first calibration code range RNG1.

According to an example embodiment, when the plurality of impedance calibration codes 20 are distributed non-linearly, the memory device 1200 may set differently each temperature code (for example, the first temperature code TCD1 to the twelfth temperature code TCD12 in FIG. 5) corresponding to each impedance calibration code (for example, the first impedance calibration code (ZQCD1) to the twelfth impedance calibration code (ZQCD12) in FIG. 5). For example, the memory device 1200 may set a second calibration code range RNG2 (for example, a first code range ZR1b to the twelfth code range ZR12b) at each test temperature (for example, the first test temperature (T1) to the twelfth test temperature (T12)). As an example, when the plurality of impedance calibration codes 20 are non-linearly distributed, the memory device 1200 may set the calibration code range RNG2 to be proportional to an slope (or an absolute value of the slope) of a graph representing the plurality of impedance calibration codes 20. As another example, a second calibration code range RNG2 (for example, the first code range ZR1b to the twelfth code range) at each test temperature (for example, the first test temperature (T1) to the twelfth test temperature (T12)) ZR12b) may be set to be smaller than the maximum value of the second calibration code range (for example, third code range ZR3b) corresponding to the maximum impedance calibration code ZQCD_max.

Figure 11:
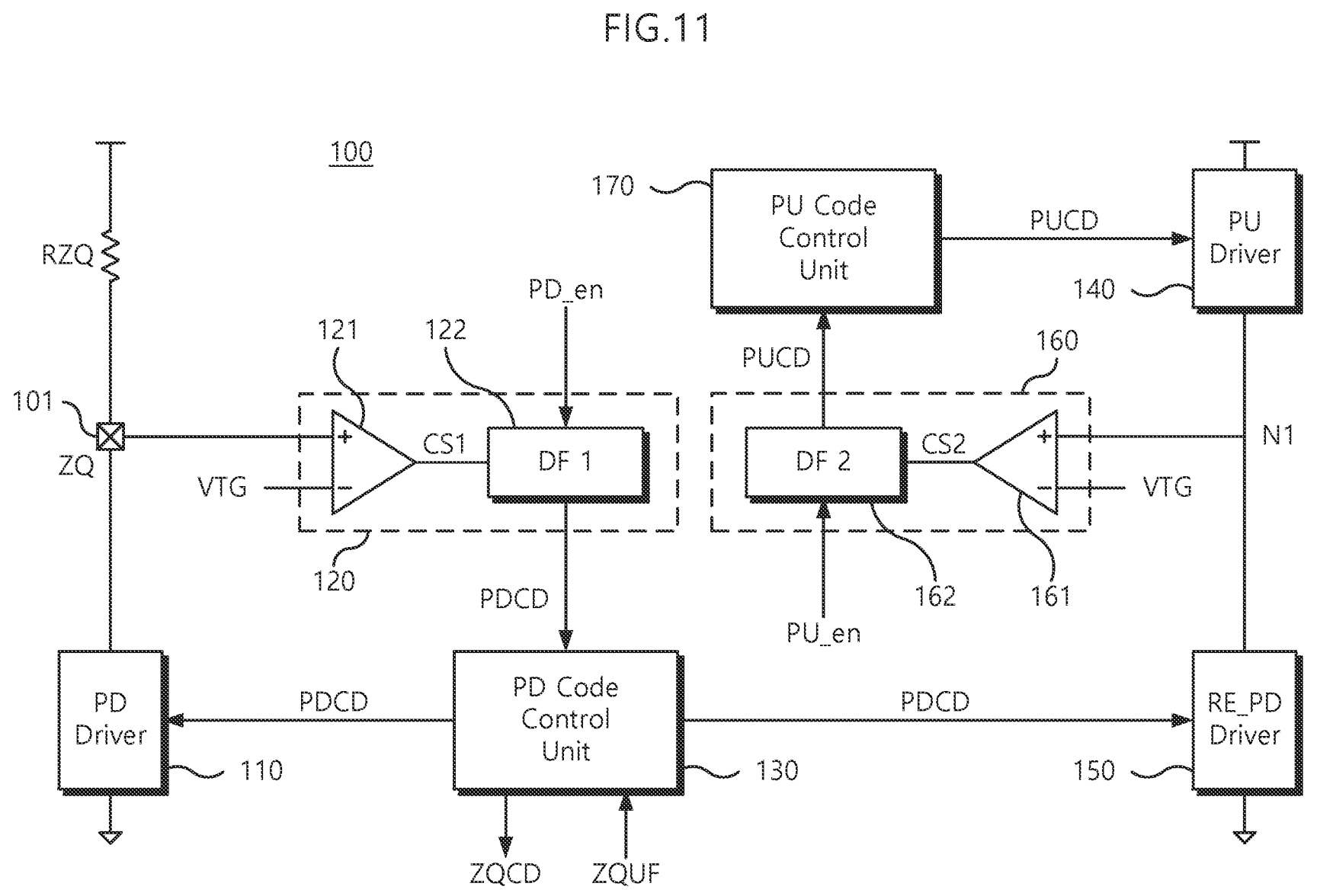

FIG. 11 is a block diagram illustrating an impedance calibration circuit of FIG. 2 according to an example embodiment. Referring to FIG. 11, the impedance calibration circuit 100 includes a pull-down driver 110 (e.g., a first driver circuit), a first code generator 120 (e.g., a first logic circuit), a pull-down code control unit 130 (e.g., a first control circuit), a pull-up driver 140 (e.g., a second driver circuit), and a replica pull-down driver 150 (e.g., a third driver circuit), a second code generator 160 (e.g., a second logic circuit) and a pull-up code control unit 170 (e.g., a second control circuit). An external resistor RZQ (for example, 240 ohms) may be connected between a power supply voltage terminal and an impedance pad ZQ.

According to an example embodiment, the pull-down driver 110 is connected between a ground terminal and the impedance pad ZQ. For example, the pull-down driver 110 may have substantially the same configuration as the pull-down driver included in the input/output circuit 1240 of FIG. 2.

According to an example embodiment, the first code generator 120 generates a pull-down impedance calibration code PDCD based on a result of comparing a voltage of the impedance pad ZQ and a target voltage VTG. For example, the first code generator 120 may include a first comparator 121 and a first digital filter 122. For example, the first comparator 121 may be a first operational amplifier. The first comparator 121 may compare the voltage of the impedance pad ZQ with the target voltage VTG to output a first comparison signal CS1. As an example, when the voltage of the impedance pad ZQ is less than or equal to the target voltage VTG, the first comparison signal CS1 may have a low level. When the voltage of the impedance pad ZQ is greater than the target voltage VTG, the first comparison signal CS1 may have a high level. The first digital filter 122 may perform a counting operation based on the first comparison signal CS1 to generate a pull-down impedance calibration code PDCD. The first digital filter 122 may be driven based on a pull-down enable signal PD_en. As an example, the first digital filter 122 may increase or decrease the pull-down impedance calibration code PDCD until a logic level of the first comparison signal CS1 transitions. The first digital filter 122 may transmit the determined pull-down impedance calibration code PDCD to the pull-down code control unit 130.

According to an example embodiment, the pull-down code control unit 130 may store the pull-down impedance calibration code PDCD transmitted from the first digital filter 122. For example, when the logic level of the first comparison signal CS1 transitions, the first digital filter 122 may transmit a pull-down impedance calibration code PDCD, and the pull-down code control unit 130 may receive the transmitted pull-down impedance calibration code PDCD. The pull-down code control unit 130 may transmit the pull-down impedance calibration code PDCD as a newly generated impedance calibration code ZQCD to the calibration control unit 200 of FIG. 2. When receiving a calibration code update flag ZQUF from the calibration control unit 200, the pull-down code control unit 130 may store the newly generated pull-down impedance calibration code PDCD. In an embodiment, when the calibration code update flag ZQUF is not received from the calibration control unit 200 within a specified time, the pull-down code control unit 130 does not store the newly generated pull-down impedance calibration code PDCD, and maintains a previous pull-down impedance.

According to an example embodiment, the pull-down code control unit 130 may transmit the stored pull-down impedance calibration code PDCD to the pull-down driver 110 or the replica pull-down driver 150. For example, when the pull-down driver 110 performs an impedance calibration operation, the pull-down code control unit 130 may transmit a pull-down impedance calibration code PDCD to the pull-down driver 110. During the impedance calibration operation of the pull-up driver 140, the pull-down code control unit 130 may transmit a pull-down impedance calibration code PDCD to the replica pull-down driver 150.

According to an example embodiment, the pull-up driver 140 is connected between the ground terminal and a first node N1. For example, the pull-up driver 140 may have substantially the same configuration as the pull-up driver included in the input/output circuit 1240 of FIG. 2. The pull-up driver 140 may be driven based on a pull-up impedance calibration code PUCD.

According to an example embodiment, the replica pull-down driver 150 is connected between the ground terminal and the first node N1. For example, the replica pull-down driver 150 may have substantially the same configuration as the pull-down driver 110. The replica pull-down driver 150 may be driven based on a pull-down impedance calibration code PDCD. The replica pull-down driver 150 may be driven together during the impedance calibration operation of the pull-up driver 140. For example, the replica pull-down driver 150 may be driven when the impedance calibration operation of the pull-up driver 140 is performed.

According to an example embodiment, the second code generator 160 generates a pull-up impedance calibration code PUCD according to a result of comparing the voltage of the first node N1 and the target voltage VTG. For example, the second code generator 160 may include a second comparator 161 and a second digital filter 162. For example, the second comparator 161 may be a second operational amplifier. The second comparator 161 may compare the voltage of the first node N1 with the target voltage VTG to output a second comparison signal CS2. As an example, when the voltage of the first node N1 is less than or equal to the target voltage VTG, the second comparison signal CS2 may have a low level. When the voltage of the first node N1 is greater than the target voltage VTG, the second comparison signal CS2 may have a high level. The second digital filter 162 may perform a counting operation based on the second comparison signal CS2 to generate a pull-up impedance calibration code PUCD. The second digital filter 162 may be driven based on a pull-up enable signal PD_en. As an example, the second digital filter 162 may increase or decrease the pull-up impedance calibration code PUCD until a logic level of the second comparison signal CS2 transitions. The second digital filter 162 may transmit the determined pull-up impedance calibration code PUCD to the pull-up code control unit 170.

According to an example embodiment, the pull-up code control unit 170 may transmit the stored pull-up impedance calibration code PUCD to the pull-up driver 140. For example, when the pull-up driver 140 performs an impedance calibration operation, the pull-up code control unit 170 may transmit a pull-up impedance calibration code PUCD to the pull-up driver 140.

Figure 12:
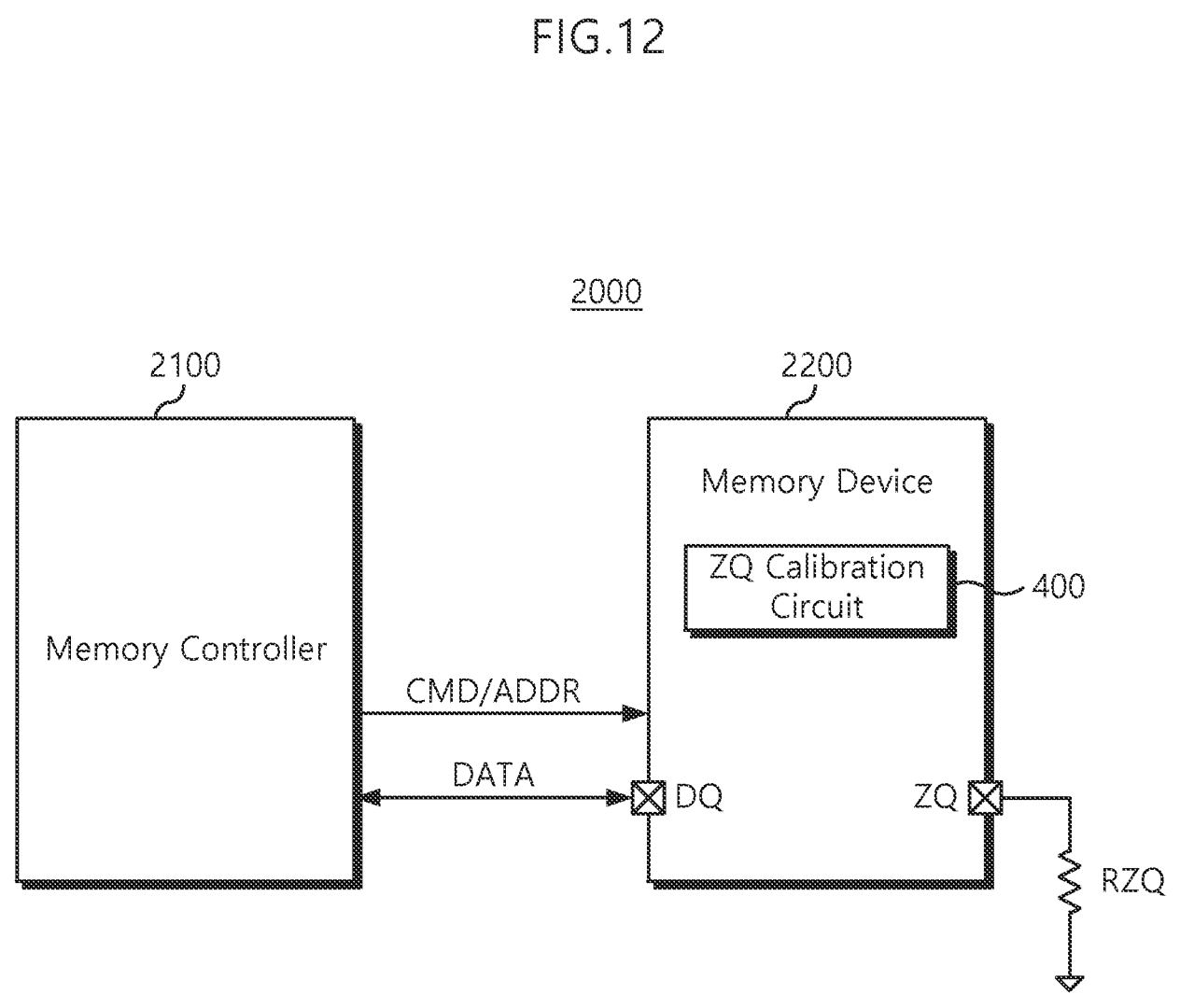

FIG. 12 is a block diagram illustrating a memory system according to an example embodiment. Referring to FIG. 12, the memory system 2000 of the present disclosure may include a memory controller 2100 and a memory device 2200. Most of configurations and features of the memory system 2000 may be the same or similar to those of the memory system 1000 of FIG. 1. Accordingly, description of configurations and features which are the same or similar to configurations and features of the memory system 1000 of FIG. 1 will be omitted.

According to an example embodiment, the memory device 2200 includes an impedance calibration circuit (or ZQ calibration circuit) 400. For example, an impedance of a data pad DQ may change according to a change in the state of the memory device 2200 (for example, process, voltage and temperature (PVT) fluctuations). The impedance calibration circuit 400 may generate an impedance calibration code used in an input/output circuit through the impedance pad ZQ. The memory device 2200 may transmit and receive data DATA by applying the impedance calibration code generated by the impedance calibration circuit 400 to the input/output circuit. As an example, an external resistance RZQ, which is used for the impedance calibration operation, may be connected between the impedance pad ZQ and the ground terminal.

According to an example embodiment, the impedance calibration circuit 400 may generate an abnormal impedance calibration code due to various causes. For example, the impedance calibration circuit 400 may generate an abnormal impedance calibration code when performing a latch operation of the impedance calibration code before completing the impedance calibration operation or when a sudden temperature change of the memory device 2200 occurs. When an abnormal impedance calibration code is applied to the input/output circuit, the memory device 2200 may exchange incorrect data with the memory controller 2100. The memory device 2200 of the present disclosure may set a range of a normal impedance calibration code. When the newly generated impedance calibration code is outside the specified code range, the memory device 2200 may block the update of the newly created impedance calibration code to prevent the abnormal impedance calibration code from being applied to the input/output circuit.

Figure 13:
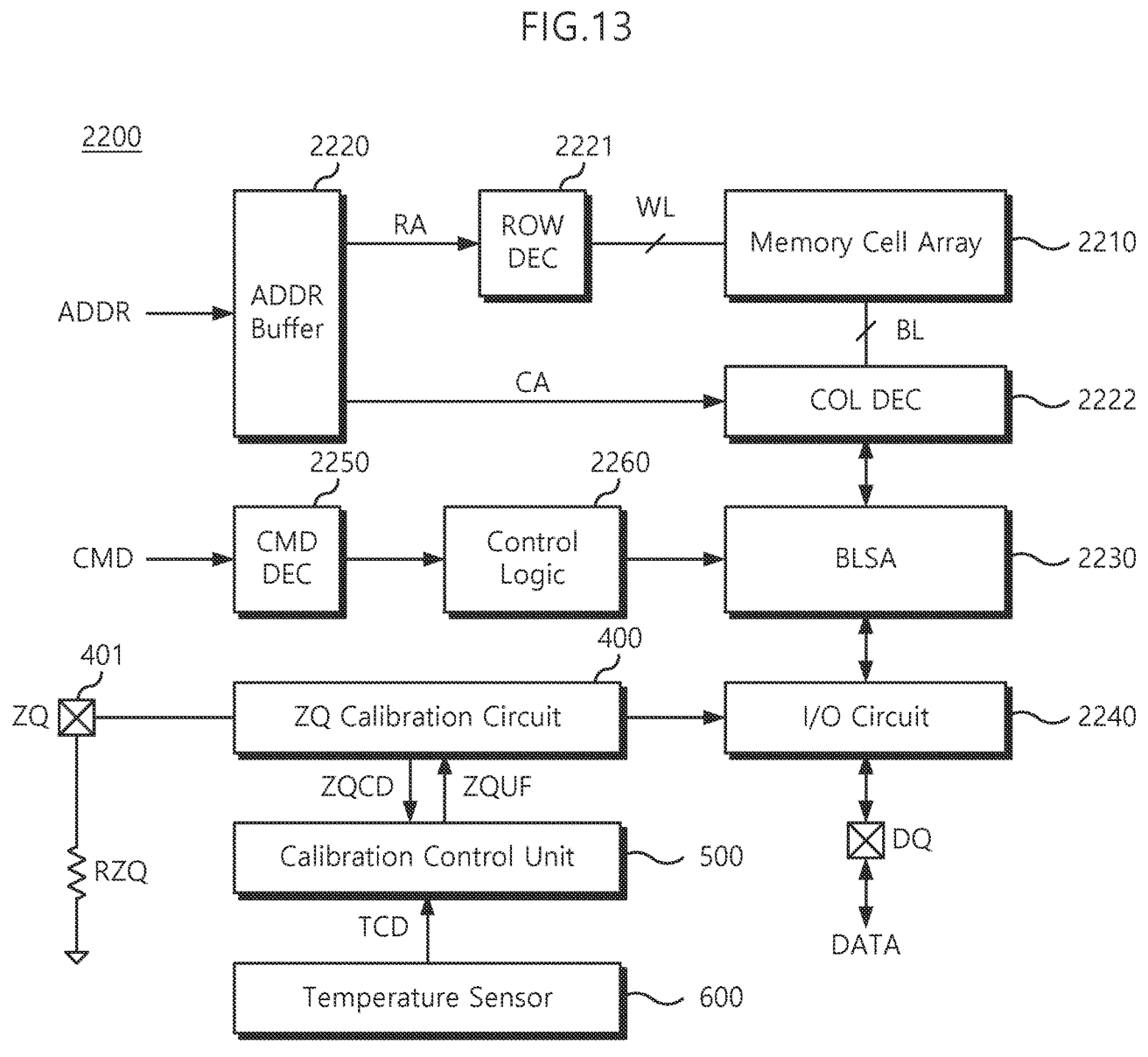

FIG. 13 is a block diagram illustrating a memory device of FIG. 12 according to an example embodiment. Referring to FIG. 13, the memory device 2200 may include a memory cell array 2210, an address buffer 2220, a row decoder 2221, a column decoder 2222, a bit line sense amplifier 2230, and an input/output circuit 2240, a command decoder 2250, control logic 2260, an impedance calibration circuit 400, a calibration control unit 500, and a temperature sensor 600. Most of configurations and features of the memory device 2200 may be the same or similar to those of the memory device 1200 of FIG. 2. Accordingly, description of configurations and features which are the same or similar to configurations and features of the memory device 1200 of FIG. 2 will be omitted.

According to an example embodiment, the impedance calibration circuit (or ZQ calibration circuit) 400 performs an impedance calibration operation to generate an impedance calibration code ZQCD applied to the input/output circuit 2240. For example, the external resistance RZQ, which is used for the impedance calibration operation, may be connected between the impedance pad 401 and the ground terminal. The impedance calibration circuit 400 may generate an impedance calibration code ZQCD applied to the input/output circuit 2240 through the impedance pad 401.

According to an example embodiment, the calibration control unit 500 checks whether the impedance calibration code ZQCD is abnormal. For example, the calibration control unit 500 may receive a newly generated impedance calibration code ZQCD from the impedance calibration circuit 400. The calibration control unit 500 may check whether the newly generated impedance calibration code ZQCD is within a specified code range. When the newly generated impedance calibration code ZQCD is included in the specified code range, the calibration control unit 500 may generate a calibration code update flag ZQUF. Depending on whether the calibration code update flag ZQUF is received, the impedance calibration circuit 400 may determine whether to update the newly generated impedance calibration code ZQCD.

As an example, the calibration control unit 500 may check whether the impedance calibration code ZQCD is included in the first code range. When the impedance calibration code ZQCD is included in the first code range, the calibration control unit 500 may receive a temperature code TCD including temperature information of the current memory device 2200 from the temperature sensor 600. The calibration control unit 500 may check whether the impedance calibration code ZQCD is included in a specified second code range corresponding to the temperature code TCD. When the impedance calibration code ZQCD is included in the second code range, the calibration control unit 500 may transmit the calibration code update flag ZQUF to the impedance calibration circuit 400. When receiving the calibration code update flag ZQUE, the impedance calibration circuit 400 may store (or update) the newly generated impedance calibration code ZQCD and provide it to the input/output circuit 2240. In an embodiment, when the impedance calibration code ZQCD is not included in the first code range or the second code range, the impedance calibration circuit 400 does not output the calibration code update flag ZQUF. In an embodiment when the calibration code update flag ZQUF is not received within a specified time after transmitting the impedance calibration code ZQCD to the calibration control unit 500, the impedance calibration circuit 400 does not update the newly generated impedance calibration code ZQCD, and retains a previous impedance calibration code.

According to an example embodiment, the temperature sensor 600 may measure the current temperature of the memory device 2200. For example, the temperature sensor 600 may transmit a temperature code TCD including current temperature information of the memory device 2200 to the calibration control unit 500.

Figure 14:
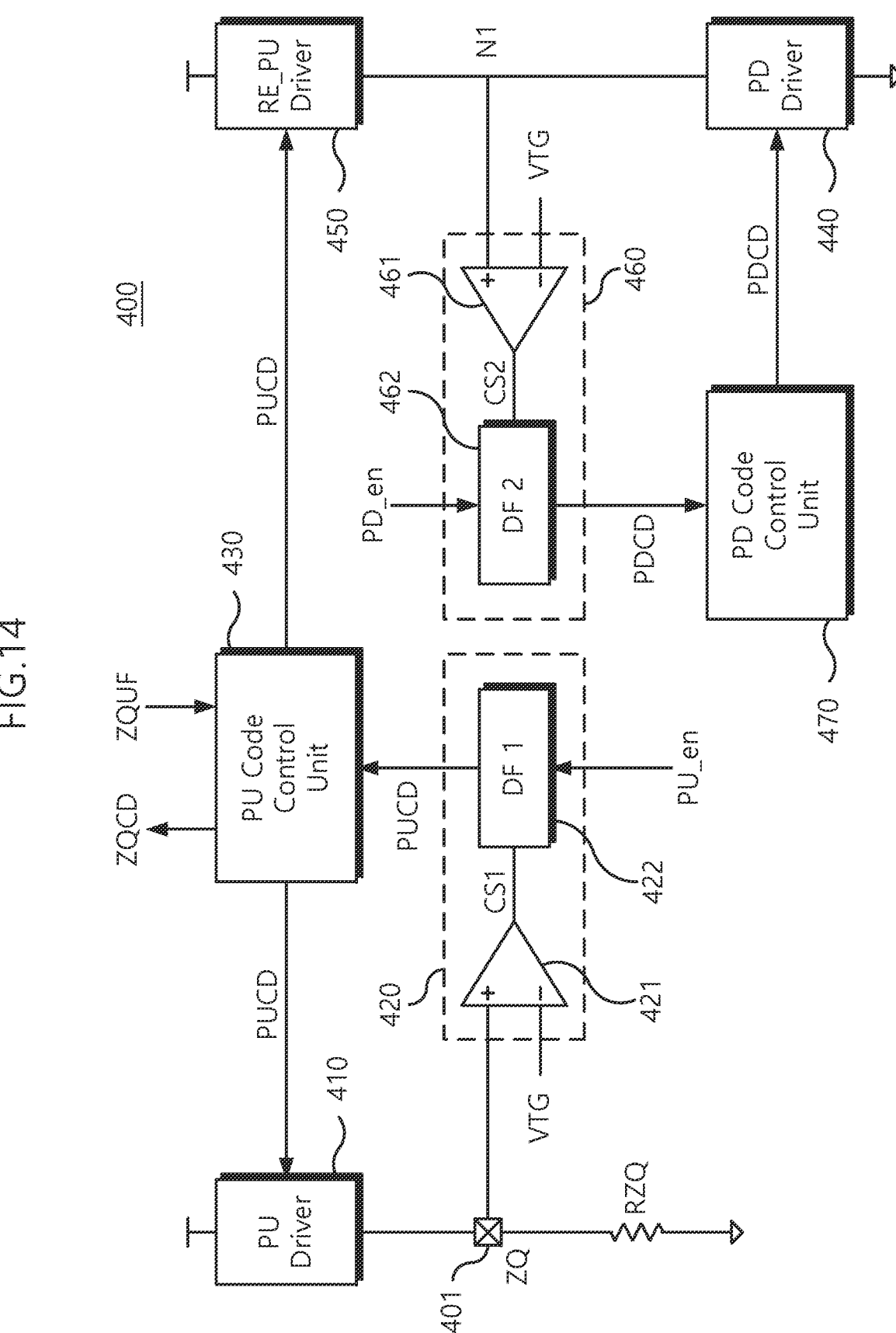
FIG. 14 is a block diagram illustrating an impedance calibration circuit of FIG. 13.

FIG. 14 is a block diagram illustrating an impedance calibration circuit of FIG. 13 according to an example embodiment. Referring to FIG. 14, the impedance calibration circuit 400 may include a pull-up driver 410 (e.g., a first driver circuit), a first code generator 420 (e.g., a first logic circuit), a pull-up code control unit 430 (e.g., a first control circuit), a pull-down driver 440 (e.g., a second driver circuit), a replica pull-up driver 450 (e.g., a third driver circuit), a second code generator 460 (e.g., a second logic circuit), and a pull-down code control unit 470 (e.g., a second control circuit). An external resistance RZQ (for example, 240 ohms) may be connected between the impedance pad 401 and the ground terminal.

According to an example embodiment, the pull-up driver 410 may be connected between a power supply voltage terminal and an impedance pad 401. For example, the pull-up driver 410 may have substantially the same configuration as the pull-up driver included in the input/output circuit 2240 of FIG. 13. The pull-up driver 410 may be driven based on a pull-up impedance calibration code PUCD.

According to an example embodiment, the first code generator 420 generates a pull-up impedance calibration code PUCD based on a result of comparing the voltage of the impedance pad 401 and the target voltage VTG. For example, the first code generator 420 may include a first comparator 421 and a first digital filter 422. For example, the first comparator 421 may be a first operational amplifier. The first comparator 421 may compare the voltage of the impedance pad 401 with the target voltage VTG to output a first comparison signal CS1. As an example, when the voltage of the impedance pad 401 is less than or equal to the target voltage VTG, the first comparison signal CS1 may have a low level. When the voltage of the impedance pad 401 is greater than the target voltage VTG, the first comparison signal CS1 may have a high level. The first digital filter 422 may perform a counting operation based on the first comparison signal CS1 to generate a pull-up impedance calibration code PUCD. The first digital filter 422 may be driven based on the pull-up enable signal PU_en. As an example, the first digital filter 422 may increase or decrease the pull-up impedance calibration code PUCD until the logic level of the first comparison signal CS1 transitions. The first digital filter 422 may transmit the determined pull-up impedance calibration code PUCD to the pull-up code control unit 430.

According to an example embodiment, the pull-up code control unit 430 may store the pull-up impedance calibration code PUCD transmitted from the first digital filter 422. For example, when a logic level of the first comparison signal CS1 transitions, the first digital filter 422 may transmit a pull-up impedance calibration code PUCD, and the pull-up code control unit 430 may receive a pull-up impedance calibration code PUCD.

The pull-up code control unit 430 may transmit the pull-up impedance calibration code PUCD as a newly generated impedance calibration code ZQCD to the calibration control unit 500 of FIG. 13. When receiving the calibration code update flag ZQUF from the calibration control unit 500, the pull-up code control unit 430 may store the newly generated pull-up impedance calibration code PUCD. In an embodiment when the calibration code update flag ZQUF is not received from the calibration control unit 500 within a specified time, the pull-up code control unit 430 does not store the newly generated pull-up impedance calibration code PUCD, and maintains a previous pull-up impedance calibration code.

According to an example embodiment, the pull-up code control unit 430 may transmit the stored pull-up impedance calibration code PUCD to the pull-up driver 410 or the replica pull-up driver 450. For example, during the impedance calibration operation of the pull-up driver 410, the pull-up code control unit 430 may transmit a pull-up impedance calibration code PUCD to the pull-up driver 410. When the pull-down driver 440 performs an impedance calibration operation, the pull-up code control unit 430 may transmit a pull-up impedance calibration code PUCD to the replica pull-up driver 450.

According to an example embodiment, the pull-down driver 440 may be connected between the ground terminal and the first node N1. For example, the pull-down driver 440 may have substantially the same configuration as the pull-down driver included in the input/output circuit 2240 of FIG. 13. The pull-down driver 440 may be driven based on a pull-down impedance calibration code PDCD.

According to an example embodiment, the replica pull-up driver 450 may be connected between the power supply voltage terminal and the first node N1. For example, the replica pull-up driver 450 may have substantially the same configuration as the pull-up driver 410. The pull-down driver 440 may be driven based on a pull-up impedance calibration code PUCD. The replica pull-up driver 450 may be driven together during the impedance calibration operation of the pull-down driver 440. For example, the replica pull-up driver 450 may be driven when the impedance calibration operation of the pull-down driver 440 is performed.

According to an example embodiment, the second code generator 460 generates a pull-down impedance calibration code PDCD based on a result of comparing the voltage of the first node N1 and the target voltage VTG. For example, the second code generator 460 may include a second comparator 461 and a second digital filter 462. For example, the second comparator 461 may include a second operational amplifier. The second comparator 461 may compare the voltage of the first node N1 with the target voltage VTG to output a second comparison signal CS2. As example, when the voltage of the first node N1 is less than or equal to the target voltage VTG, the second comparison signal CS2 may have a low level. When the voltage of the first node N1 is greater than the target voltage VTG, the second comparison signal CS2 may have a high level. The second digital filter 462 may perform a counting operation based on the second comparison signal CS2 to generate a pull-down impedance calibration code PDCD. The second digital filter 462 may be driven based on the pull-down enable signal PD_en. As example, the second digital filter 462 may increase or decrease the pull-down impedance calibration code PDCD until the logic level of the second comparison signal CS2 transitions. The second digital filter 462 may transmit the determined pull-down impedance calibration code PDCD to the pull-down code control unit 470.

According to an example embodiment, the pull-down code control unit 470 may transmit the stored pull-down impedance calibration code PDCD to the pull-down driver 440. For example, when the pull-down driver 440 performs an impedance calibration operation, the pull-down code control unit 470 may transmit a pull-down impedance calibration code PDCD to the pull-down driver 440.

According to at least one embodiment of the present disclosure, a memory device may reduce data input or output error by preventing update of an abnormal impedance calibration code.

According to at least one embodiment of the present disclosure, the memory device may prevent update of an impedance calibration code in an abnormal regardless of how the state was caused or reached.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A memory device comprising:
   a memory cell array;
   an input/output circuit configured to control inputting of data to the memory cell array and outputting of data stored in the memory cell array;
   an impedance calibration circuit configured to generate an impedance calibration code based on an external resistor connected to an impedance pad for application to the input/output circuit as an applied impedance calibration code; and
   a calibration control circuit configured to compare a new impedance calibration code received from the impedance calibration circuit with a calibration code range to generate a calibration code update flag when the new impedance calibration code is included in the calibration code range,
   wherein the impedance calibration circuit is configured to update the applied impedance calibration code with the new impedance calibration code when receiving the calibration code update flag.

2. The memory device of claim 1, wherein the impedance calibration circuit is configured to discard the new impedance calibration code and maintain the applied impedance calibration code when the calibration code update flag is not received within a specified time after transmitting the new impedance calibration code to the calibration control circuit.

3. The memory device of claim 1, wherein the calibration control circuit does not generate the calibration code update flag when the new impedance calibration code is outside the calibration code range.

4. The memory device of claim 1, wherein the calibration control circuit comprises:

a code range register configured to store the calibration code range; and a code comparator configured to determine whether the new impedance calibration code is included in the calibration code range and generate the calibration code update flag when the new impedance calibration code is included in the calibration code range.

5. The memory device of claim 4, wherein the code comparator is configured to generate an abnormal code detection flag when the new impedance calibration code is not included in the calibration code range and store the abnormal code detection flag in a mode register.

6. The memory device of claim 5, further comprising:

control logic configured to transmit the abnormal code detection flag to a memory controller when receiving a mode register read command from the memory controller.

7. The memory device of claim 5, further comprising:

a temperature sensor configured to generate a temperature code corresponding to a temperature of the memory device, wherein the code comparator comprises:

a first sub-comparator configured to determine whether the new impedance calibration code is included in a first calibration code range; and a second sub-comparator configured to determine whether the new impedance calibration code is included in a second calibration code range, which is smaller than the first calibration code range, corresponding to the temperature code.

8. The memory device of claim 7, wherein the first sub-comparator is configured to:

receive the new impedance calibration code from the impedance calibration circuit;

transmit the new impedance calibration code to the second sub-comparator when the new impedance calibration code is included in the first calibration code range; and output the abnormal code detection flag when the new impedance calibration code is outside the range of the first calibration code.

9. The memory device of claim 8, wherein the second sub-comparator is configured to:

receive the new impedance calibration code from the first sub-comparator;

output the calibration code update flag when the new impedance calibration code is included in the second calibration code range; and output the abnormal code detection flag when the new impedance calibration code is outside the range of the second calibration code.

10. The memory device of claim 7, wherein the first calibration code range is determined based on a minimum calibration code and a maximum calibration code among test impedance calibration codes generated within an operating temperature range of the memory device.

11. The memory device of claim 7, wherein the second calibration code range is a range specified around each test impedance calibration code corresponding to each temperature code within an operating temperature range of the memory device.

12. The memory device of claim 11, wherein the second calibration code range is set the same in a plurality of temperature codes.

13. The memory device of claim 11, wherein the second calibration code range is set differently for each of a plurality of temperature codes.

14. A memory device comprising:

a memory cell array;

an input/output circuit configured to control inputting of data to the memory cell array and outputting of data stored in the memory cell array;

an impedance calibration circuit configured to generate an impedance calibration code based on an external resistor for application to the input/output circuit as an applied impedance calibration code; and a calibration control circuit configured to compare a new impedance calibration code received from the impedance calibration circuit with a calibration code range to generate a calibration code update flag when the new impedance calibration code is included in the calibration code range, wherein the impedance calibration circuit comprises:

an impedance pad connected to the external resistor;

a pull-down driver connected to the impedance pad;

a code generator configured to compare a voltage of the impedance pad and a target voltage to generate a new impedance calibration code; and a pull-down code control circuit configured to receive the new impedance calibration code and update the applied impedance calibration code to the new impedance calibration code when receiving the calibration code update flag within a specified time after transmitting the new impedance calibration code to the calibration control circuit.

* * * * *